United States Patent [19]

Ohkura et al.

[11] Patent Number: 5,119,097
[45] Date of Patent: Jun. 2, 1992

[54] ANALOG-TO-DIGITAL CONVERTER HAVING DECREASED REFERENCE VOLTAGE TO REDUCE DISPLAY FLICKER

[75] Inventors: Kazuma Ohkura; Masahiro Ishikawa, both of Kanagawa, Japan

[73] Assignee: Nissan Motor Company, Limited, Yokohama, Japan

[21] Appl. No.: 230,978

[22] Filed: Aug. 11, 1988

[30] Foreign Application Priority Data

Aug. 13, 1987 [JP] Japan .................. 62-123086

[51] Int. Cl.$^5$ .............................................. H03M 1/00
[52] U.S. Cl. ..................................... 341/158; 341/154
[58] Field of Search ............... 341/118, 119, 120, 121, 341/153, 154, 158, 159, 161, 164, 166, 169, 162, 163, 165

[56] References Cited

U.S. PATENT DOCUMENTS

| 4,196,420 | 4/1980 | Culmer et al. | 341/156 |
| 4,293,848 | 10/1981 | Cheng et al. | 341/165 |
| 4,542,368 | 9/1985 | Lillis | 341/120 |
| 4,544,912 | 10/1985 | Iwamoto et al. | 341/158 |
| 4,647,903 | 3/1987 | Ryu | 341/163 |

FOREIGN PATENT DOCUMENTS

| 84620 | 5/1982 | Japan | 341/158 |
| 182331 | 8/1986 | Japan | 341/161 |
| 2115247 | 9/1983 | United Kingdom | 341/158 |

OTHER PUBLICATIONS

Analog-Digital Conversion Handbook, Analog Devices Inc., 1986, pp. 216-217.
Millman, Microelectronics: Digital and Analog Circuits and Systems, 1979, McGraw-Hill, pp. 610-611.
"A/D and DA Conversion Technique for a Microcomputer", published on Nov. 5, 1982 from Nikkan Kogyo Shibunsha by Iwao Sagara, pp. 79-81 and 122-125.

Primary Examiner—Howard L. Williams
Attorney, Agent, or Firm—Foley & Lardner

[57] ABSTRACT

A parallel comparison type A/D converter having a hysterisis is disclosed in which a reference voltage level for comparing with an input analog signal is switched according to a digital converted signal so that the output digital value has a hysterisis characteristic with respect to the input analog signal. Thus, no flickers or chattering in a displayed segment of a display unit occurs when the input analog signal has a value in close to one of the reference voltages to be compared.

15 Claims, 3 Drawing Sheets

DIGITAL OUTPUT VALUE

ANALOG-TO-DIGITAL CONVERTER HAVING DECREASED REFERENCE VOLTAGE TO REDUCE DISPLAY FLICKER

BACKGROUND OF THE INVENTION (1) Field of the invention

The present invention relates generally to an apparatus for converting an analog signal into a corresponding digital signal, in which a reference voltage level for determining an analog-to-digital conversion is controlled in accordance with a digital output signal thereof and having a hysterisis characteristic in which the input voltage is compared to a first set of threshold voltages as the input voltage increases and is compared to a second set of threshold voltages as the input voltage decreases.

(2) Background of the Art

A parallel comparison type analog-to-digital converter (hereinafter referred to as an A/D converter) has commercially been available on a market.

In the comparison-type A/D converter, a resistor ladder having series connected resistors for dividing a supplied reference voltage to provide a plurality of reference voltages receives a selected value of a counter for a reference clock decoded by means of a decoder. The reference voltage to be compared is selected and outputted to a comparator in which the reference signal is compared with an input analog signal. When both signals coincide with each other, a gate signal is supplied to a register. The value of the counter is held and outputted as a digital output value.

However, such an A/D converter as described above is appropriate to monolithic conditions. An output digital value is not stable for the input signal in range of a comparison voltage.

For example, in a digital water temperature meter for a vehicle, the analog signal from the sensor is processed by means of a processing circuit and the water temperature is finally indicated through an turned on or turned off of a segment such as a liquid display.

In the processing circuit, the A/D converter is indispensable for the digital display. The digital display unit displays a continuous analog signal as the turn-on and turn-off of a segment of the digital display unit, i.e., a discontinuous value. If the analog signal is minutely varied in the vicinity of a level at which the segment is switched to the turn on or turn off state, the turn on-and-off of the segment is repeated and difficult to view. Therefore, an unpleasant feeling afflicts the user.

To prevent such a problem as described above, the number of segments need to be increased, i.e., the resolution of the A/D converter needs to be increased. If the digital display unit becomes comparable to the analog display unit, the circuit becomes complex at a remarkable cost increase is involved.

If a certain characteristic is provided in the display mechanism or in the A/D converter, flickers in the output value due to noise can be prevented.

Some A/D-conversion and digital display systems having such a characteristic have been proposed.

The A/D converter converts the input signal from a sensor, such as a thermistor into the digital value. A digital delay circuit updates the output value when this digital value repeats the same value a particular number of times, or carries out the output processing such that an average value for the particular number of times is derived and outputted. A decoder decodes the output value of the digital delay circuit for the display segment and a driver drives and displays a display unit.

In the later example, the flickers (or chattering) of the turn-on-and off of the segment through the processing of the digital delay circuit is prevented. However, a favorable response characteristic to a change in the sensor output cannot be achieved. Therefore, its application range is limited.

In another example, the sensor input signal is converted into the digital value by means of a high resolution A/D converter. If a change in the digital value from the A/D converter falls in a particular range, the value outputted to the decoder is not updated.(Refer to a New Version Automotive Engineering Manual Volume 7, page 62, published in Japan by Automotive Engineering Society, May 31, 1983).

For example, in a case of a 2-bit A/D conversion, relationship between the sensor input level and 2-bit digital output value is established. If the digital output is used to drive the digital display unit by means of the decoder and driver, the flickers of the turn on-and-off of one segment of the display unit due to minute fluctuations of the sensor input signal can be prevented. The response characteristic is also improved.

However, in the above-described latter example, in the way as at least three-bit A/D converter is needed for the 2-bit display resolution, at least an A/D converter having an accuracy double the resolution of the display unit becomes necessary. Accordingly, its circuit scale is substantially double or more. In addition, if the system for the A/D conversion and display function is constructed in the hardware such as a custom IC, its circuit scale becomes large and uneconomical.

SUMMARY OF THE INVENTION

It is, therefore, an object of the present invention to provide an apparatus for converting an analog signal into a corresponding digital signal in which no flickering occurs in a segment on the digital display unit, and the displayed contents can be viewed to provide no unpleasant feeling for a viewer in a case where an analog input signal is fluctuated in a vicinity of a level at which one segment of the display unit is switched on.

It is another object of the present invention to provide an economical and small-scale A/D converter.

It is still another object of the present invention to provide the A/D converter which has a favorable response characteristic.

The above-described objects can be achieved by providing an apparatus for converting an analog signal into a digital signal, comprising: (a) a plurality of series-connected first resistors for dividing a power supply voltage into respective reference voltages,(b) first means for comparing an input analog signal with each of the reference voltages derived by the first resistors and outputting a signal whenever one of the reference voltages exceeds the input analog signal; and (c) second means responsive to the signal from the first means for changing at least one reference voltage and providing a digital output which corresponds to the input analog signal derived by the first resistors.

The above-described objects can also be achieved by providing an apparatus, comprising: (a) a comparator for comparing an input analog signal with a reference voltage and outputting a signal when the reference voltage exceeds the input analog signal,(b) first means for providing the reference voltage for the comparator;(c), an oscillator for generating and outputting clock pulses; (d) a counter for counting the number, of clock pulses and providing a count signal indicative of this number, the reference voltage being sequentially being changed according to the count signal.,(e) second means for outputting a latch signal upon a first receipt of the output signal from the comparator since the count signal indicates zero., and (f) third means for providing the count signal of the counter as an output signal of the apparatus upon receipt of the latch signal and changing the reference voltage of the first means upon receipt of the latch signal by a predetermined value.

The above-described objects can also be achieved by providing an apparatus for converting an input analog signal into a digital signal, comprising (a) first means for comparing an input analog signal with a sequentially changed reference voltage and outputting a signal when the reference voltage first exceeds the input analog signal.(b), second means including a plurality of resistors for discretely changing the reference voltage and providing the reference voltage for the comparator,(c) third means associated with the first means for discretely changing resistance values of the resistors according to the signal derived by the comparator.(,d) an oscillator for providing a clock signal.(e), a counter for counting the number of clock signals, the first means changing the resistance values of the resistors according to the contents of the counter, and (f) third means for providing the count value of the counter as the output digital signal in response to the signal from the comparator.

DETAILED DESCRIPTION OF THE PREFERRED EMBODIMENTS

Reference will hereinafter be made to the drawings in order to facilitate understanding of the present invention.

Figure 1:
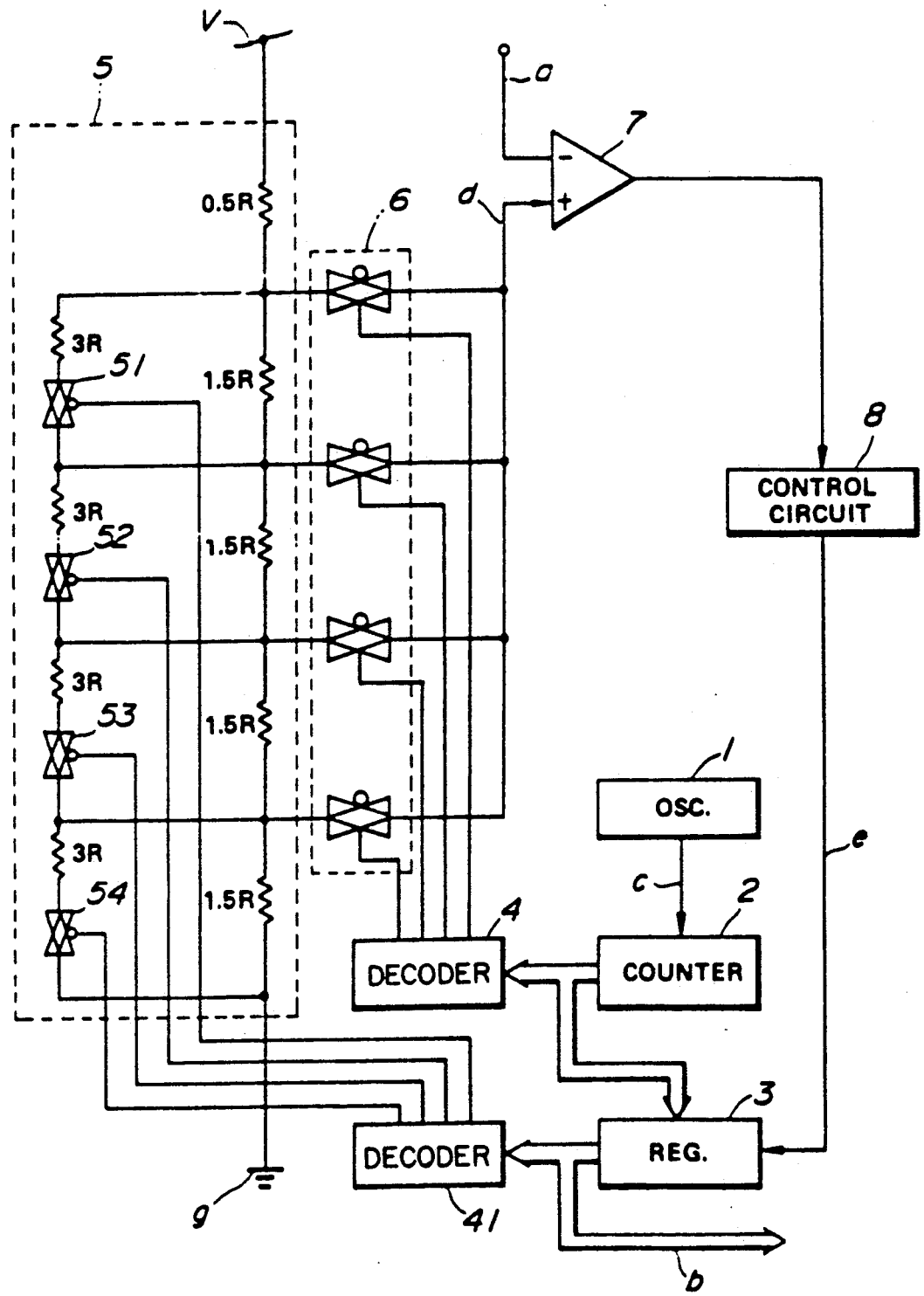
FIG. 1 is a schematic circuit block diagram of an A/D converter in a first preferred embodiment according to the present invention.

FIG. 1 shows a first preferred embodiment of an A/D converter according to the present invention.

In FIG. 1, a two-bit counter 2 counts a clock c outputted by an oscillator 1. The count value is decoded by means of a decoder 4. An output value of the decoder 4 causes an open and close of an analog switch bank 6 to select a reference voltage d from terminal voltages of a resistor ladder 5. The level of the reference voltage d is compared with the input signal a by means of a comparator 7. It should be noted that a control circuit 8 outputs a high-level latch signal e when the output signal of the comparator 7 is first turned to high since the count value of the counter 2 has indicated zero.

A register 3 latches the value of the counter 2 when the latch signal e indicates high level. A decoder 41 is provided for decoding a value of the output signal b which indicates an A/D conversion of the above-described input signal a. A resistor ladder 5 constituted by a plurality of resistors and analog switches A to D (51 to 54) which open or close according to an output signal of the decoder 41 are inserted between a reference voltage supply v and ground g for providing each DC voltage level derived from a division of the reference voltage supply value for the analog switch bank 6. The output of the decoder 41 controls the voltage division ratio.

Next, an operation of the A/D converter in the first preferred embodiment will be described.

Figure 2:
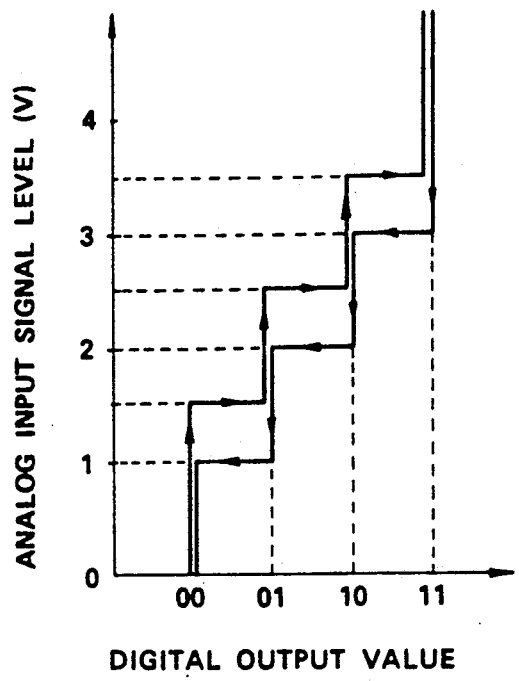
FIG. 2 is a graph representing a relationship between an sensor input signal level and output digital value.

A ratio of the resistance value shown in FIG. 2 is provided with each resistance value, e.g., the reference voltage supply v is 5 volts. The analog switches A to C (51 to 53) are turned on in response to the output of the decoder 41 when the digital output b indicates 00. The level appearing on each tap of the resistor ladder 5 is 1.5 V 2.5 V 3.5 V, and 4.5 V in a lower order as viewed from FIG. 1. In addition, when the digital output b indicates 01, the analog switches A, B, and D (51, 52, 54) are turned on and the levels appearing on the respective taps indicate 1V, 2.5V, 3.5V, and 4.5V in the lower order. In the same way, when the digital output b indicates 11, the analog switches B to D (52 to 54) are turned on and the levels appearing on the respective taps indicate 1V, 2V, 3V, and 4.5V.

When the decoder output 41 indicates 1000 with the register output indicating 00, the analog switch 54 is turned off and the analog switches 51 to 53 are turned on.

When the decoder output 41 indicates 0100 with the register output indicating 01, only the analog switch 53 is turned off. When the decoder output 41 indicates 0010 with the register output indicating 10, only the analog switch 52 is turned off. When the decoder output 41 indicates 0001 with the register output indicating 11, only the analog a switch 51 is turned off.

On the other hand, the counter 2 counts the number of clocks c generated by the oscillator 1. The analog switch 6 is open and closed in accordance with the value of the counter 2 so that the level of the reference voltage d is changed.

When the counter output 2 indicates 00, the decoder output 4 indicates 1000 and only the lowest analog switch in the analog switch bank 6 is turned on. Therefore, an initial compared reference voltage d is 1.5 volts. When the counter output 2 indicates 01, the decoder output 4 indicates 0010 and the second lowest analog switch is turned on. When the counter output 2 indicates 10, the decoder output 4 indicates 0010 and the second highest analog switch is turned on. When the counter output 2 indicates 11, the decoder output 4 indicates 0001 and the highest analog switch is turned on. In this way, the analog switch bank 6 is tuned on sequentially from the lowest analog switch as the counter output 2 is incremented.

The comparator 7 compares the levels of the reference voltage d and input signal a and outputs the high level when the reference voltage d is higher.

In this way, since the value of the counter 2 when the control circuit 8 outputs the latch signal e is latched in the register 3 to provide the digital output b, a relationship between the input signal level a and the digital output signal value b is established as shown in FIG. 2.

In addition, in the first preferred embodiment, since a load applied to the reference voltage supply v is always constant even if the digital output b is changed, it is extremely advantageous for the monolithic ICs, etc.

Figure 3:
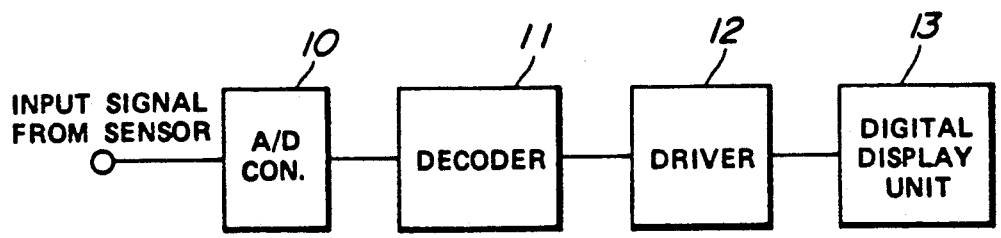
FIG. 3 is a schematic circuit block diaphragm of a digital water temperature meter utilizing the A/D converter according to the present invention.

FIG. 3 shows a block diaphragm of a digital water temperature meter utilizing the A/D converter according to the present invention.

The output digital value of the sensor input signal is decoded for a display segment of a digital display unit 13 and a driver 12 drives to display the decoded digital value on the digital display unit 13.

In the way described above, no flickers in the turn on-and-off of a displayed segment occurs for minute fluctuations due to noises superposed on the sensor input. Therefore, it is possible to carry out the display of the water temperature in a high response.

It is noted that the value of the input/output characteristic of FIG. 2 can be changed by an appropriate selection of a resistance value of the resistor ladder 6.

Figure 4:
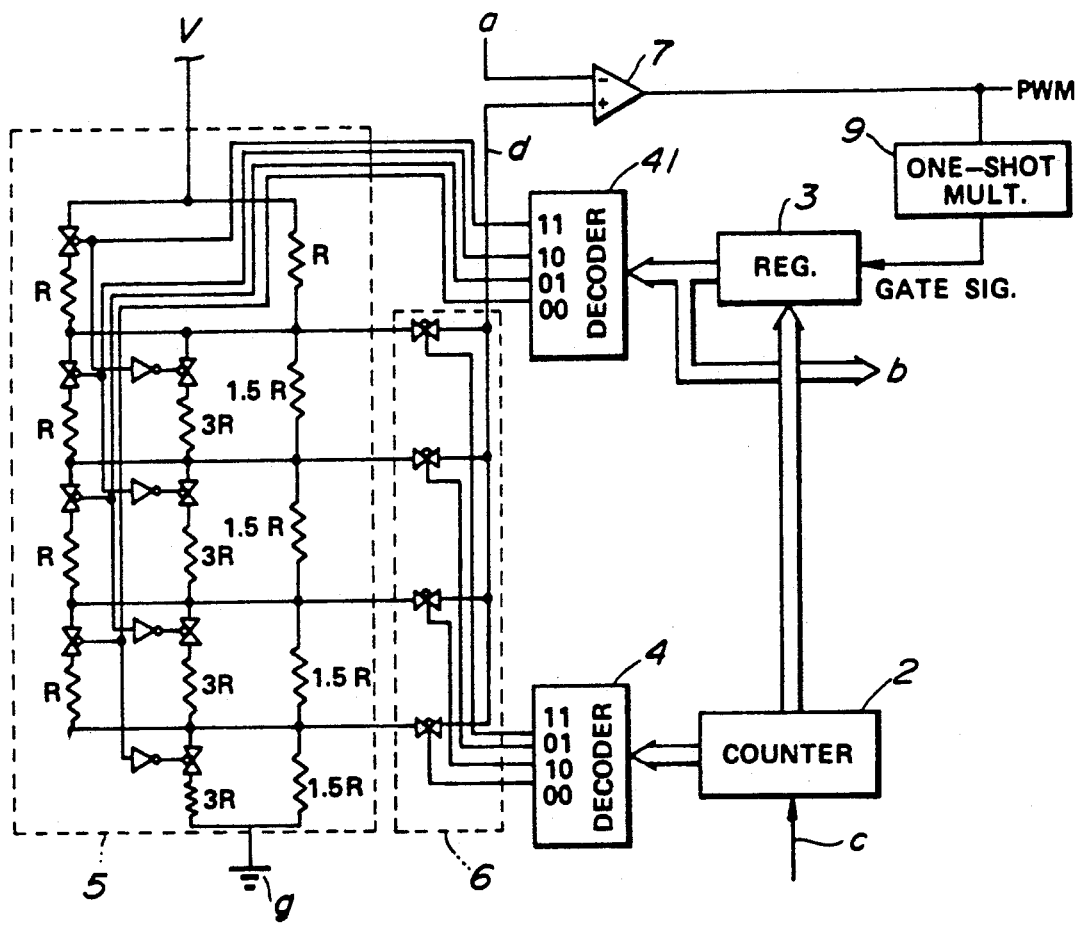
FIG. 4 is a schematic circuit block diagram of the A/D converter in a second preferred embodiment according to the present invention.

FIG. 4 shows a second preferred embodiment of the A/D converter according to the present invention.

In FIG. 4, a one-shot multivibrator 9 receives an output pulse (PWM) indicating a result of comparison between the analog input signal and reference voltage. An output pulse signal of the multivibrator 9 serves as a gate signal to the register 3. The ladder 5 is constituted by three rows of resistor groups arranged in parallel to each other. The same effects as those derived in the first preferred embodiment can be achieved.

The present invention can be applied to multiple bit A/D converters other than the two-bit A/D converter.

As described hereinabove, since, in the A/D converter according to the present invention, the digital output value of the A/D converter causes the switching control of the reference voltage level in the, A/D conversion, the A/D converter having the input/output characteristic of FIG. 2 can be achieved without increase in the resolution of the A/D converter or without the addition of a large scale and complex processing circuit. If minute fluctuations due to noises superposed on the analog input signal occur and an input value in the vicinity of the comparison voltage is present, a stable digital output value of the A/D converter can be achieved with a good response characteristic in the A/D conversion.

It will fully be appreciated by those skilled in the art that the foregoing description is made in terms of the preferred embodiments and various changes and modifications can be made without departing from the scope of the present invention which is to be defined by the appended claims.

What is claimed is:

1. An apparatus for converting an analog signal to a digital signal, comprising:
   a plurality of series-connected first resistors for dividing a power supply voltage into respective reference voltages;
   first means for comparing an input analog signal with each of the reference voltages derived by the first resistors and outputting a signal whenever one of the reference voltages exceeds the input analog signal and
   second means responsive to the signal from the first means for changing at least the reference voltage closest to, but less than, the voltage of the input analog signal, and providing a digital output which corresponds to the first reference voltage detected, which exceeds the input analog signal, such that the reference voltage compared to the analog input signal as the analog input signal is increasing in value is different than the reference voltage compared to the analog input signal as the analog input signal is decreasing in value.

2. An apparatus as set forth in claim 1, wherein the first means comprises a comparator.

3. An apparatus as set forth in claim 2, wherein the second means comprises:
   (a) an oscillator which generates and outputs a clock signal;
   (b) a counter for counting the clock signal;
   (c) a control circuit which receives the digital signal and outputs a latch signal, the latch signal being outputted when the signal from the comparator is first received since the counter indicates zero;
   (d) an oscillator which generates and outputs a clock signal;
   (e) a counter for counting the clock signal;
   (f) a register which latches an output count value of the counter in response to the latch signal from the control circuit;
   (g) a first decoder for decoding the output count value;
   (h) a plurality of first switches which receive a decoded output signal from the first decoder and switches to change the reference voltages to be supplied to the comparator,
   (i) a plurality of second resistors each connected across the corresponding first resistor via a corresponding second switch, and
   (j) a second decoder for decoding the output signal from the register so that a total resistance value of each first resistor is changed according to the decoded output signal of the second decoder.

4. An apparatus as set forth in claim 3, wherein the first and second switches are analog switches.

5. An apparatus as set forth in claim 1, which further comprises: (a) a decoder for decoding the analog-to-digital converted and decoded signal;
   (b) a driver for driving the analog-to-digital converted and decoded signal;
   (c) a segment display unit for displaying the contents of the analog-to-digital converted, decoded, and driven signal through a numerical display device constituted by a plurality of segments.

6. An apparatus as set forth in claim 3, wherein the second resistors comprise a plurality of resistors each resistor connected across the corresponding first resistor via the corresponding second switch, and each second switch being connected to the second decoder.

7. An apparatus as set forth in claim 6, wherein the control circuit comprises a one-shot multivibrator.

8. An apparatus as set forth in claim 3, wherein the counter comprises a two-bit counter.

9. An apparatus as set forth in claim 5, wherein the input analog signal is derived from a water temperature sensor.

10. An apparatus as set forth in claim 9, wherein the water temperature sensor senses a cooling water temperature of an engine mounted in an automotive vehicle.

11. An apparatus, comprising:
    (a) a comparator for comparing an input analog signal with a reference voltage and outputting a signal when the reference voltage exceeds the input analog signal;
    (b) first means for providing the reference voltage for the comparator;
    (c) an oscillator for generating and outputting clocks;

(d) a counter for counting the number of clocks and providing a count signal indicative of the number of clocks, the reference voltage being sequentially changed according to the count signal;

(e) second means for outputting a latch signal upon a first receipt of the output signal from the comparator since the count signal indicates zero; and (f) third means for providing the count signal of the counter as an output signal of the apparatus upon receipt of the latch signal and changing the reference voltage of the first means upon receipt of the latch signal by a predetermined value such that the reference voltage compared to the analog input signal as the analog input signal increases in value is different than the reference voltage compared to the analog input signal as the analog input signal decreases in value.

12. The apparatus as set forth in claim 11, wherein the counter is automatically reset to zero whenever the number of clocks reaches a predetermined value.

13. The apparatus as set forth in claim 12, wherein the reference voltage is stepwise increased according to the count signal.

14. The apparatus as set forth in claim 13, wherein the third reduces the instantaneous reference voltage to be compared upon receipt of the latch signal.

15. An apparatus for converting an input analog signal into a digital signal, comprising:

(a) first means for comparing an input analog signal with a multiple level sequentially changed reference voltage and outputting a signal when the reference voltage first exceeds the input analog signal;

(b) second means including a plurality of resistors for providing the multiple level sequentially changed reference voltage for the first means;

(c) third means associated with the first means and the second means for controlling the resistors used to generate each level of said multiple level reference voltage and for altering at least one level of said multiple level reference voltage according to the output signal of the first means;

(d) an oscillator for providing a clock signal;

(e) a counter for counting the number of clock signals, the second means sequentially changing the level of said multiple level reference voltage provided to said first means according to the contents of the counter; and (f) fourth means for providing the count value of the counter as the output signal in response to the signal from the first means.

* * * * *